(12) United States Patent
Agashe et al.

(10) Patent No.: US 10,149,032 B2
(45) Date of Patent: Dec. 4, 2018

(54) INTEGRATED PARTICLE AND LIGHT FILTER FOR MEMS DEVICE

(71) Applicant: Apple Inc., Cupertino, CA (US)

(72) Inventors: Janhavi S. Agashe, San Jose, CA (US); Anthony D. Minervini, Palos Hills, IL (US); Ruchir M. Dave, San Jose, CA (US); Jae H. Lee, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/726,306

(22) Filed: Oct. 5, 2017

(65) Prior Publication Data

US 2018/0220216 A1      Aug. 2, 2018

Related U.S. Application Data

(63) Continuation-in-part of application No. 15/419,663, filed on Jan. 30, 2017.

(51) Int. Cl.
*H01L 29/84* (2006.01)
*H04R 1/08* (2006.01)
(Continued)

(52) U.S. Cl.
CPC .............. *H04R 1/08* (2013.01); *B81B 3/0083* (2013.01); *B81B 3/0089* (2013.01); *G02B 5/208* (2013.01);
(Continued)

(58) Field of Classification Search
CPC .......... B81B 7/0038; B81B 2201/0257; B81B 2207/012; B01D 46/0002; B81C 1/00285;
(Continued)

(56) References Cited

U.S. PATENT DOCUMENTS 8,058,144 B2   11/2011   Bhagavat et al.
9,056,760 B2    6/2015   Feiertag et al.
(Continued)

OTHER PUBLICATIONS

Apple Inc., Non-Final Office Action dated Jul. 13, 2017, U.S. Appl. No. 15/419,663.
Apple Inc., Non-Final Office Action dated Dec. 4, 2017, U.S. Appl. No. 15/419,663.
(Continued)

*Primary Examiner* — Tu-Tu Ho
(74) *Attorney, Agent, or Firm* — Womble Bond Dickinson (US) LLP

(57) ABSTRACT

A micro-electro-mechanical system (MEMS) transducer including an enclosure defining an interior space and having an acoustic port formed through at least one side of the enclosure. The transducer further including a compliant member positioned within the interior space and acoustically coupled to the acoustic port, the compliant member being configured to vibrate in response to an acoustic input. A back plate is further positioned within the interior space, the back plate being positioned along one side of the compliant member in a fixed position. A filter is positioned between the compliant member and the acoustic port, and the filter includes a plurality of axially oriented pathways and a plurality of laterally oriented pathways which are acoustically interconnected and dimensioned to prevent passage of a particle from the acoustic port to the compliant member.

20 Claims, 12 Drawing Sheets

(51) Int. Cl.
  *B81B 3/00*    (2006.01)
  *G02B 5/20*    (2006.01)
  *H04R 19/00*   (2006.01)
  *H04R 19/04*   (2006.01)
  *G02B 5/26*    (2006.01)

(52) U.S. Cl.
  CPC ............. *G02B 5/26* (2013.01); *H04R 19/005* (2013.01); *H04R 19/04* (2013.01); *B81B 2201/0257* (2013.01)

(58) Field of Classification Search
  CPC ........ H04R 1/08; H04R 19/005; H04R 19/04; H04R 31/003
  USPC ........................................................ 257/416
  See application file for complete search history.

(56)  References Cited

U.S. PATENT DOCUMENTS

| | | |
|---|---|---|
| 9,078,063 B2 | 7/2015 | Loeppert et al. |
| 9,237,402 B2 | 1/2016 | Loeppert |
| 9,438,972 B2 | 9/2016 | Wang et al. |
| 2010/0284553 A1* | 11/2010 | Conti ................... B81B 7/0061 381/174 |
| 2014/0307909 A1 | 10/2014 | Yang et al. |
| 2016/0345084 A1 | 11/2016 | Friza et al. |

OTHER PUBLICATIONS

Apple Inc., Notice of Allowance dated Apr. 16, 2018, U.S. Appl. No. 15/419,663.

\* cited by examiner

INTEGRATED PARTICLE AND LIGHT FILTER FOR MEMS DEVICE

CROSS-REFERENCE TO RELATED APPLICATION

The application is a continuation-in-part of U.S. patent application Ser. No. 15/419,663, filed Jan. 30, 2017 and incorporated herein by reference.

FIELD

Embodiments of the invention relate to a micro-electro-mechanical system (MEMS) device having an integrated particle and light filter; and more specifically, to a MEMS microphone having an integrated particle filter to prevent particle ingress and a light filter that prevents light from entering the microphone.

BACKGROUND

In modern consumer electronics, audio capability is playing an increasingly larger role as improvements in digital audio signal processing and audio content delivery continue to happen. There is a range of consumer electronics devices that are not dedicated or specialized audio playback or pick-up devices, yet can benefit from improved audio performance. For instance, portable computing devices such as laptops, notebooks, and tablet computers are ubiquitous, as are portable communications devices such as smart phones. These devices, however, do not have sufficient space to house relatively large microphones or speakers. Thus, microphones and speakers sizes are becoming more and more compact and decreasing in size. In addition, due to the compact devices within which microphones and speakers are implemented, they are often located close to the associated acoustic input or output ports of the device and therefore susceptible to failure due to particle, water and light ingress.

SUMMARY

In one embodiment, the invention relates to a MEMS device, for example a MEMS microphone, having an integrated particle filter made up of a number of material layers which form interconnected pathways dimensioned to trap particles therein. In addition, the microphone may further include a light filter that blocks light within an ultraviolet (UV), visible or infrared (IR) wavelength range from entering the device. In addition, the MEMS microphone having the integrated filter therein may be formed using batch processing MEMS operations and entire wafer dicing and down stream processing is done as if it were a single wafer.

More specifically, in one embodiment, the invention is directed to a micro-electro-mechanical system (MEMS) transducer, such as a MEMS microphone assembly, having an integrated particle filter. The MEMS transducer may include an enclosure defining an interior space and having an acoustic port formed through at least one side of the enclosure. A compliant member configured to vibrate in response to an acoustic input may further be positioned within the interior space and acoustically coupled to the acoustic port. A back plate may be positioned within the interior space along one side of the compliant member in a fixed position. The MEMS transducer may further include a particle filter positioned between the compliant member and the acoustic port. The particle filter may include a plurality of axially oriented pathways and a plurality of laterally oriented pathways that are acoustically interconnected and dimensioned to prevent passage of a particle from the acoustic port to the compliant member. For example, the filter may include a plurality of material layers and the plurality of axially oriented pathways may be holes extending through the plurality of material layers and the plurality of laterally oriented pathways may be spaces extending along, or otherwise between, the plurality of material layers. The transducer may further include a light filter that is part of the particle filter and/or positioned between the particle filter and the acoustic port. The light filter may be reflective or opaque to light in at least one of an infrared (IR), visible or ultraviolet (UV) light wavelength range. Representatively, the light filter may include a light barrier material formed on a surface of the particle filter that faces the acoustic port. For example, the light filter may include a metal plated on a surface of the particle filter. In some embodiments, the light filter includes at least two different material layers. At least one of the at least two different material layers may be a polymer material, and/or the material may be nickel or gold. In some embodiments, the light filter includes at least three different material layers, and at least one of the at least three different material layers may be an adhesive layer. For example, the light filter may include a polymer layer, an adhesive layer on the polymer layer and a metal layer on the adhesive layer. The light filter may include a plurality of openings that are aligned with the plurality of axially oriented pathways of the particle filter. In some embodiments, the light filter may be formed by one of the material layers of the particle filter. In some cases, the compliant member, the back plate, the particle filter and the light filter are part of a MEMS microphone formed using a MEMS processing technique.

Another embodiment of the invention may include a MEMS microphone assembly having a substrate through which an acoustic port is formed and a MEMS microphone coupled to the substrate. The MEMS microphone may include a compliant member acoustically coupled to the acoustic port, a back plate positioned along one side of the compliant member in a fixed position and a filter including a plurality of material layers that define a plurality of acoustic pathways which are acoustically interconnected, and the plurality of pathways comprise holes formed through each of the plurality of material layers and spaces separating each of the plurality of material layers. In one embodiment, at least one of the plurality of material layers is opaque or reflective to light in at least one of an infrared (IR), visible or ultraviolet (UV) light wavelength range. For example, the plurality of material layers may include at least one silicon layer and at least one metal layer, and the metal layer is formed between the silicon layer and the acoustic port. In still further embodiments, at least one of the plurality of material layers that is opaque or reflective to light prevents light from entering the filter. For example, the layer may include a stack up of a polymer layer, an adhesive layer and a metal layer or may include a metal coating. In some cases, the at least one of the plurality of material layers that is opaque or reflective to light includes axially oriented holes. In some embodiments, at least two of the plurality of material layers are opaque or reflective to light in at least one of an infrared (IR), visible or ultraviolet (UV) light wavelength range, and one of the at least two layers faces the acoustic port and another of the at least two layers faces the compliant member.

Another embodiment of the invention includes a process for manufacturing a micro-electro-mechanical system (MEMS) microphone assembly including providing a substrate and forming a MEMS microphone on the substrate, the MEMS microphone having a compliant member, a back plate positioned along one side of the compliant member, a particle filter comprising a plurality of pathways which are acoustically interconnected and dimensioned to prevent passage of a particle to the compliant member, and a light filter that is opaque or reflective to light. In some embodiments, forming the light filter of the MEMS microphone may include the operations of providing a polymer layer, laminating the polymer layer with an electrically conductive adhesive layer, forming openings in the polymer layer and the electrically conductive adhesive layer, and forming a light barrier layer on a surface of the electrically conductive adhesive layer.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

In the following description, reference is made to the accompanying drawings, which illustrate several embodiments of the present invention. It is understood that other embodiments may be utilized, and mechanical compositional, structural, electrical, and operational changes may be made without departing from the spirit and scope of the present disclosure. The following detailed description is not to be taken in a limiting sense, and the scope of the embodiments of the present invention is defined only by the claims of the issued patent.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
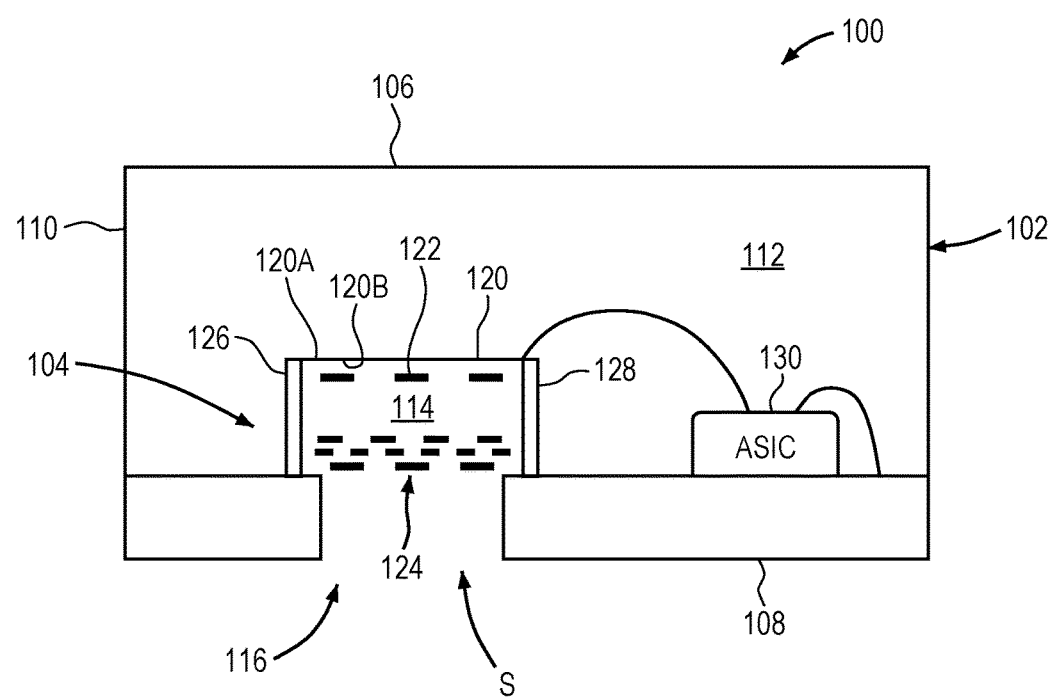
FIG. 1 is a schematic cross-section of one embodiment of a MEMS device.

FIG. 1 is a schematic cross-section of one embodiment of a MEMS device. In one embodiment, the MEMS device may be a MEMS transducer. For example, the MEMS device may be a MEMS microphone assembly 100. The MEMS microphone assembly 100 may be any type of microphone assembly or module that includes a microphone that can be used in an electronic device to pick up sound and convert it to an electrical signal. In one embodiment, MEMS microphone assembly 100 includes an enclosure 102 within which a microphone 104, such as a MEMS microphone, is positioned. Enclosure 102 may include a top wall or top side 106, a bottom wall or bottom side 108 and a side wall 110 connecting the top side 106 to the bottom side 108. The combination of the top side 106, bottom side 108 and side wall 110 may define an enclosed volume, chamber, or space 112 which surrounds microphone 104 and other components of microphone assembly 100 positioned within enclosure 102. In some embodiments, one or more of the top side 106, bottom side 108 and/or side wall 110 may be integrally formed with one another as a single unit. In other embodiments, one of the sides may be formed by a substrate having circuitry formed therein (e.g., a printed circuit board). For example, top side 106 and side wall 110 may be one integrally formed structure, for example a lid or cover, that is mounted to a bottom side 108, which is formed by a substrate (e.g., a silicon substrate), to form the enclosed space within which the various components can be positioned.

Enclosure 102 may further include an acoustic port 116 that allows for a sound from the environment surrounding enclosure 102 to be input to microphone 104 within enclosure 102. In FIG. 1, acoustic port 116 is shown formed within bottom side 108 of enclosure 102. Microphone assembly 100 of FIG. 1 may therefore be considered, or referred to herein as, a "bottom port" microphone. In other embodiments, acoustic port 116 may be formed within top side 106 of enclosure 102. In such embodiments, microphone assembly 100 may be considered a "top port" microphone. In still further embodiments, acoustic port 116 may be formed through side wall 110.

Microphone 104 may be positioned within enclosure 102 as shown. For example, microphone 104 may be mounted to, or formed with, bottom side 108 of enclosure 102. As previously discussed, bottom side 108 may be a substrate having circuitry (e.g., a printed circuit board) and microphone 104, or any of its associated components, may be electrically connected to the circuitry. Microphone 104 could be a MEMS microphone as previously mentioned, which is integrally formed with the substrate using MEMS processing techniques. In other embodiments, the MEMS microphone separately formed and then mounted to the substrate. Microphone 104 may include, among other features, a sound pick-up surface 120, a back plate 122 and a filter 124 that are suspended within enclosure 102 by support members 126, 128. Sound pick-up surface 120 may be any type of member suitable for operation as a sound pick-up surface for a MEMS microphone. For example, sound pick-up surface 120 may be a silicon plate that operates as a microphone diaphragm, membrane or otherwise compliant member that can vibrate in response to an acoustic input (e.g., a sound wave entering acoustic port 116). Back plate 122 may be positioned along a side of sound pick-up surface 120 and in a fixed position with respect to sound pick-up surface 120. For example, back plate 122 may be between sound pick-up surface 120 and acoustic port 116 (e.g., below the side of sound pick-up surface 120 facing acoustic port 116). In other embodiments, back plate 122 is between sound pick-up surface 120 and top wall 106 of enclosure 102 (e.g., above the side of sound pick-up surface 120 facing top wall 106), or in some cases, could be part of top wall 106. In some embodiments, the sound pick-up surface 120 and the back plate 122 may be conductive (e.g., have an electrode coupled thereto) such that they form a variable capacitor in which the transduction principle is the capacitance change between fixed back plate 122 and the movable sound pick-up surface 120 caused by the incoming wave of sound. Microphone circuitry (e.g., an application-specific integrated circuit (ASIC) 130) may then convert the change in capacitance into a digital or analog output.

Filter 124 may be an integrated particle and light filter positioned between sound pick-up surface 120 and acoustic port 116. In other words, the sound pick-up surface 120, back plate 122 and filter 124 may be formed as a single unit using MEMS processing techniques. Filter 124 is therefore considered "integrated" in that it is formed with, and inseparable from, the remaining components (e.g., sound pick-up surface 120 and acoustic port 116) of microphone 104 during a MEMS processing operation. In this aspect, filter 124 is different from a filter which might be separately mounted, or adhered to, the microphone and over an input port, after the microphone is manufactured. For example, filter 124 may include a series of interconnected holes, openings, passages, pathways, or the like, which are formed within or between, silicon layers and allow for the passage of an acoustic input (e.g., sound waves) to sound pick-up surface 120 but prevent the passage of undesirable particles. In some cases, filter 124 may further block, or otherwise serve as a barrier to, light entry. Further details regarding the structure of filter 124 will be described in reference to FIG. 2A-FIG. 7 and a MEMS process for forming filter 124 will be described in reference to FIG. 8-FIG. 16.

It should further be understood that in the illustrated embodiment, the space 112 formed by enclosure 102 can be considered a back volume chamber which is acoustically coupled to a first side 120A of sound pick-up surface 120. Microphone 104 may further include a front volume chamber 114 that is acoustically coupled to a second side 120B of sound pick-up surface 120. In some embodiments, the back volume chamber or space 112 is a substantially sealed chamber that is acoustically isolated from the surrounding ambient environment and the front volume chamber 114. The front volume chamber 114 may acoustically connect the sound pick-up surface 120 to acoustic port 116 such that an acoustic input (e.g., sound wave (S)) through acoustic port 116 can travel to sound pick-up surface 120.

In some embodiments, microphone assembly 100 may further include an ASIC 130 as previously discussed. For example, ASIC 130 could be mounted to bottom wall 108 of enclosure 102 as shown. ASIC 130, however, may be mounted to other sides of enclosure 102 as desired (e.g., top side 106). ASIC 130 may be electrically connected to microphone 104 and circuitry within the bottom wall 108 (e.g., where bottom wall is a substrate) by wires (or other electrically conductive coupling means) and be used to convert the change in capacitance of microphone 104 as previously discussed, into a digital or analog microphone output.

Figure 2A:
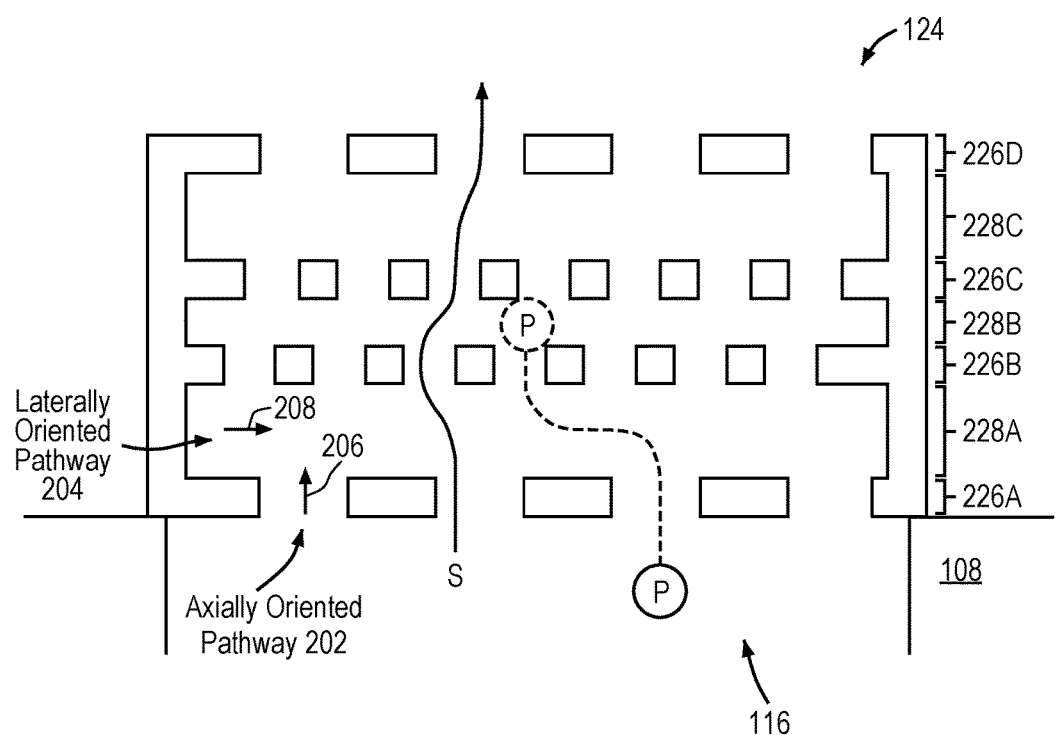
FIG. 2A is a magnified view of a cross-section of one embodiment of a filter of a MEMS device.
Figure 2B:
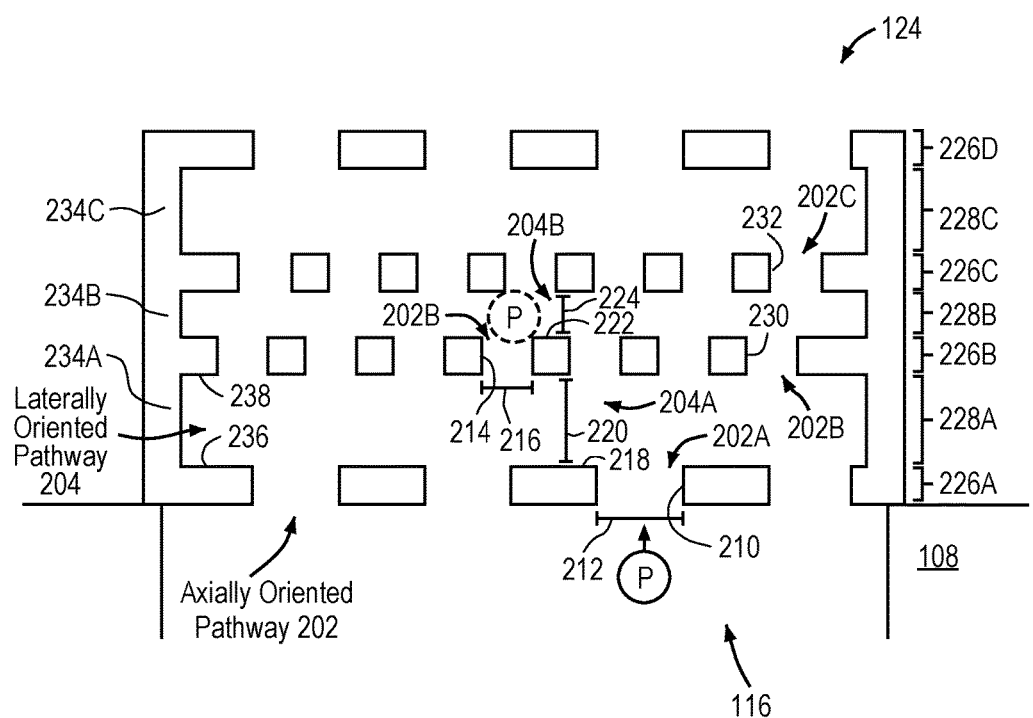
FIG. 2B is a magnified view of the cross-section of the filter of FIG. 2A.

Aspects of one exemplary embodiment of a filter will now be discussed in more detail in reference to FIG. 2A-FIG. 2B. In particular, FIG. 2A and FIG. 2B are magnified views of a cross-section of one embodiment of a filter of a MEMS device. The filter may be filter 124 previously discussed in reference to FIG. 1. In this aspect, filter 124 is integrally formed with the other microphone components (e.g., sound pick-up surface 120 and back plate 122) and positioned over acoustic port 116 within bottom side 108 of enclosure 102. From this view, it can be seen that filter 124 is made up of a number of interconnected pathways 202, 204 that allow for sound (S) to pass through filter 124 to the sound pick-up surface 120 (see FIG. 1) while preventing the passage of one or more of a particle (P). The interconnected pathways 202, 204 may have different orientations, sizes, shapes, dimensions, and/or arrangements that are designed to trap, prevent, or increase a resistance to, particle (P) so that it does not pass entirely through filter 124.

Representatively, as can be seen from FIG. 2A, in one embodiment, pathways 202 may be considered axially oriented pathways that cause the sound wave (S) and/or particle (P) to travel in a substantially axial direction as illustrated by arrow 206 (e.g., a direction parallel to an axis of acoustic port 116). Pathways 204, may in turn, be considered laterally oriented pathways which redirect the passage of the sound wave (S) and/or particle (P) in a substantially lateral direction as illustrated by arrow 208. Each of pathways 202 and pathways 204 are interconnected such that they create a tortuous network of channels that are easy for sound waves (S) to pass through but difficult for particle (P) to pass through. For example, as shown in FIG. 2A, in some embodiments, the axially oriented pathways 202 are arranged in rows 226A, 226B, 226C and 226D, and the laterally oriented pathways 204 are arranged in rows 228A, 228B and 228C. Rows 226A-226D and rows 228A-228C may include any number of pathways necessary to provide a tortuous pathway for particle ingress. In addition, rows 226A-226D of axially oriented pathways 202 may be arranged in an alternating pattern with the rows 228A-228C of laterally oriented pathways 204 such that any particle (P) traveling through filter 124 is continuously redirected through a multi-layered network of pathways, thus making it more difficult to pass through filter 124.

The sizes, shapes, dimensions and/or arrangements of axially oriented pathways 202 and/or laterally oriented pathways 204 themselves may be selected to further prevent the passage and/or trap particle (P) within filter 124. Representatively, in some embodiments, the sizes, shapes, and/or dimensions of pathways 202 and 204 are selected to vary a resistance of the pathways to the passage of particle (P). For example, a size of an opening to one or more of pathways 202 and/or pathways 204 and/or the size of the entire pathway, may be different so that the particle (P) may initially pass through some pathways, but then get trapped when it reaches others. Representatively, the sizes of the openings to the pathways, or the pathways themselves, of filter 124 may decrease or become narrower in a direction toward the compliant membrane such that a particle may be able to enter the filter through the larger openings or pathways near acoustic port 116, but then becomes trapped by the smaller openings or pathways within filter 124. The sizes may be selected depending upon the size of particle the filter is intended to trap or otherwise prevent passage of. For example, the size of some openings may be larger than the anticipated particle size, while the size of other openings closer to the compliant member within the MEMS device may be smaller than the anticipated particle size such that the particle cannot pass through them.

For example, as shown in FIG. 2B, in one embodiment, a size (e.g., width 212) of an opening 210 of an axially oriented pathway 202A may be different than a size (e.g., width 216) of an opening 214 to another axially oriented pathway 202B. In addition, a size (e.g., width 220) of an opening 218 of a laterally oriented pathway 204A may be different than a size (e.g., width 224) of another laterally oriented pathway 204B. For example, the size (e.g., width 212) of opening 210 of axially oriented pathway 202A may be greater than a size (e.g., width 216) of opening 214 to axially oriented pathway 202B, and the size (e.g., width 220) of opening 218 of laterally oriented pathway 204A may be greater than a size (e.g., width 224) of laterally oriented pathway 204B. In this aspect, particle (P) entering filter 124 from acoustic port 116 may pass through opening 210 to the axially oriented pathway 202A and travel through opening 218 to the laterally oriented pathway 204B but then start meeting resistance at opening 214 to the next axially oriented pathway 202B and opening 222 to the next laterally oriented pathway 204B, and eventually become trapped within laterally oriented pathway 204B.

In addition, it should be understood that in some embodiments, the sizes of the axially oriented pathways 202 may vary with respect to the laterally oriented pathways 204. For example, opening 210 to axially oriented pathway 202A may be greater than opening 218 to laterally oriented pathway 204A and opening 222 to laterally oriented pathway 204B.

In addition, in some embodiments, a width along an entire length of a pathway may be the same as the corresponding opening to the pathway, therefore one pathway may also be referred to herein as having a narrower or wider passage way or channel for particle ingress than another pathway. For example, axially oriented pathway 202A may be considered wider than axially oriented pathway 202B, laterally oriented pathway 204A may be considered wider than laterally oriented pathway 204B and/or one or more of the axially oriented pathways 202A, 202B, may be considered wider or narrower than another of the laterally oriented pathways 204A, 204B.

Other variations in the relative sizes, shapes, dimensions and/or arrangements of the axially oriented pathways 202 and laterally oriented pathways 204 which would cause a particle (P) to become trapped within filter 124 are also contemplated. For example, in some embodiments, axially oriented pathways 202 within one of rows 226A-226D may be arranged such that they overlap, or are laterally or axially offset, with respect to axially oriented pathways 202 within another one of rows 226A-226D. For example, as can also be seen from FIG. 2B, an opening 230 of the axially oriented pathway 202B in row 226B is laterally or axially offset with respect to an opening 232 of the axially oriented pathway 202C in row 226C. Said another way, an axis of opening 230 and the axis of opening 232 are not aligned. In addition, there is at least one laterally oriented pathway 204 (e.g., row 228B) between each of the axially oriented openings 230 and 232. In this aspect, a straight pathway from one axially oriented pathway or opening to another axially oriented pathway or opening is prevented, thus creating even more tortuous arrangements within the pathways and thereby further increasing a resistance of the filter to the passage of particles (P).

In some embodiments, this alternating arrangement of axially oriented pathways 202 and laterally oriented pathways 204 may be formed by a stack up of material layers, with some of the layers forming the axially oriented pathways and some of the layers forming the laterally oriented pathways 204 in between. For example, row 226A may be a material layer (e.g., layer of silicon) through which more than one hole or opening 210 is formed to create a number of axially oriented pathways 202 within row 226A. Similarly, rows 226B-226D may be additional material layers having additional holes or openings which form the remaining axially oriented pathways 202 within rows 226B-226D. Each of these material layers forming rows 226A-226D may be stacked on top of each other and spaced apart using spacers 234A, 234B and 234C. The corresponding gaps or spaces between each of rows 226A-226D then form the rows 228A-228C of laterally oriented pathways 204. In other words, laterally oriented pathways 204 may be formed by interfacing surfaces of the adjacent rows (e.g., interfacing surfaces 236, 238 of rows 226A, 226B, respectively). It is further contemplated, however, that in other embodiments, rows 226A-226D including axially oriented pathways 202 could be stacked directly on top of one another (not spaced apart) and rows 228A-228C, including laterally oriented pathways 204, omitted. In this embodiment, the sizes and/or alignment of the axially oriented pathways between rows is varied to create a network of tortuous pathways as previously discussed. For example, the axially oriented pathways within one row may be offset with respect to the axially oriented pathways within the immediately adjacent rows, such as by making some smaller than others or if they are of the same size, misaligning the openings. Details with respect to the stack up of material layers forming the axially oriented pathways 202 and laterally oriented pathways 204 will be discussed in more detail in reference to FIG. 5-FIG. 13.

Figure 3:
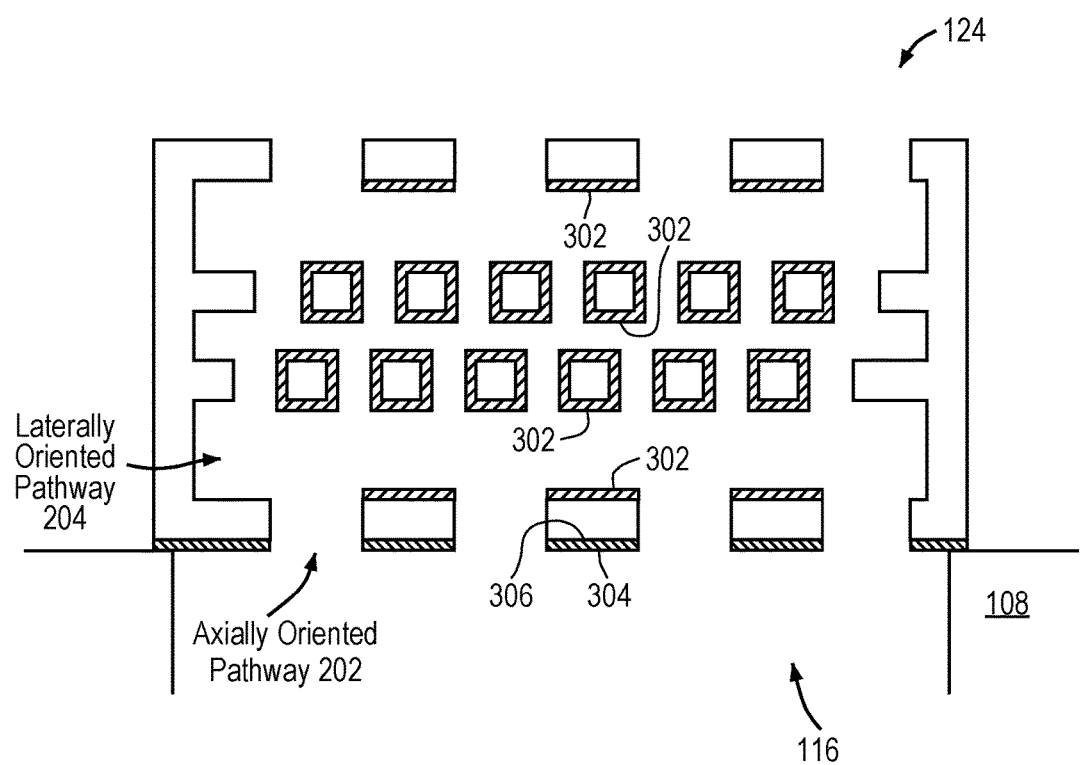
FIG. 3 is a magnified view of another embodiment of a filter of a MEMS device.

FIG. 3 is a magnified view of another embodiment of a filter of a MEMS device. In this embodiment, filter 124 is substantially similar to filter 124 described in reference to FIG. 1 and FIG. 2A-2B, except in this embodiment, the pathways 202 and/or 204 include one or more coatings. For example, in one embodiment, the coatings further enhance a resistance to the passage of a particle through filter, and/or the passage of liquids. In particular, one or more of pathways 202, 204 may include a surface coating 302 that helps to trap particles within pathways 202, 204. Representatively, surface coating 302 may be an anti-stiction surface coating that is applied to at least one surface of pathways 202, 204. In some embodiments, surface coating 302 may be applied to any pathway surfaces that are within the interior of filter 124 in order to maximize the trapping of particles within filter 124. Representative anti-stiction surface coatings may include, but are not limited to, a self-assembled monolayer (SAM) coating including a fluorinated fatty acid, or a siloxane SAM coating. It should be understood, however, that these are only representative examples of anti-stiction coatings, and that any coating suitable for enhancing a resistance of a pathway to the passage of a particle may be used. In addition, surface coating 302 may be a conformal coating having a same thickness along one or more of pathways 202, 204, or may have different thicknesses among pathways 202, 204, as desired. For example, in some embodiments, the thickness of the surface coating 302 may be non-conformal so that the size of some pathways are smaller (or narrower) than other pathways, thus further increasing a resistance of the pathways to particle passage. In still further embodiments, it is also contemplated that the coating may be a coating that traps the particle upon contact with only a single filter surface and does not require two filter surfaces to trap the particle. In other words, a coating that is the opposite of the anti-stiction coating, which allows for two surfaces having momentary contact with one another to trap the particle, and then separate.

In addition, in some embodiments, a hydrophobic coating 304 may further be applied to filter 124 to help prevent water ingress through pathways 202 and/or 204. Representatively, hydrophobic coating 304 may be applied to the exterior surface 306 of filter 124, which faces acoustic port 116. In this aspect, water which passes through acoustic port 116 will be repelled away from filter 124, and in turn, pathways 202, 204 within filter 124.

In still further embodiments, the coating 302 and/or coating 304 may be a material which blocks light from entering the associated transducer in order to reduce noise that may be caused by light entering the device. For example, the coating 302 and/or 304 may be a light blocking material that is reflective or opaque to light in the ultraviolet (UV), visible and/or infrared (IR) wavelength ranges. Representatively, the light blocking material may be reflective or opaque to light within a range of from about 10 nanometers (nm) to 400 nm, from about 400 nm to 700 nm, and/or from about 700 nm to 1000000 nm. For example, the light blocking material may be a metal or other material reflective or opaque to light and may form a coating along at least one layer or surface of filter 124, for example, a surface forming one or more of pathways 202 or 204. In some embodiments, the light blocking coating or material may be formed along the exterior surface 306 of filter 124, as shown by coating 304. It is contemplated, however, that the light blocking material may be formed along all surfaces of the outer layer of filter 124, in addition to surface 306. It is further contemplated that in some embodiments, the light blocking coating or material may make up the entire outer layer of filter 124. The light blocking coating, material or layer may be between filter 124 and acoustic port 116 such that it forms a light blocking barrier which prevents light from entering acoustic port 116, and in turn, helps to reduce noise in the transducer. Further details regarding a representative light blocking coating, layer or barrier will now be discussed in reference to FIG. 4, FIG. 5 and FIG. 6.

Figure 4:
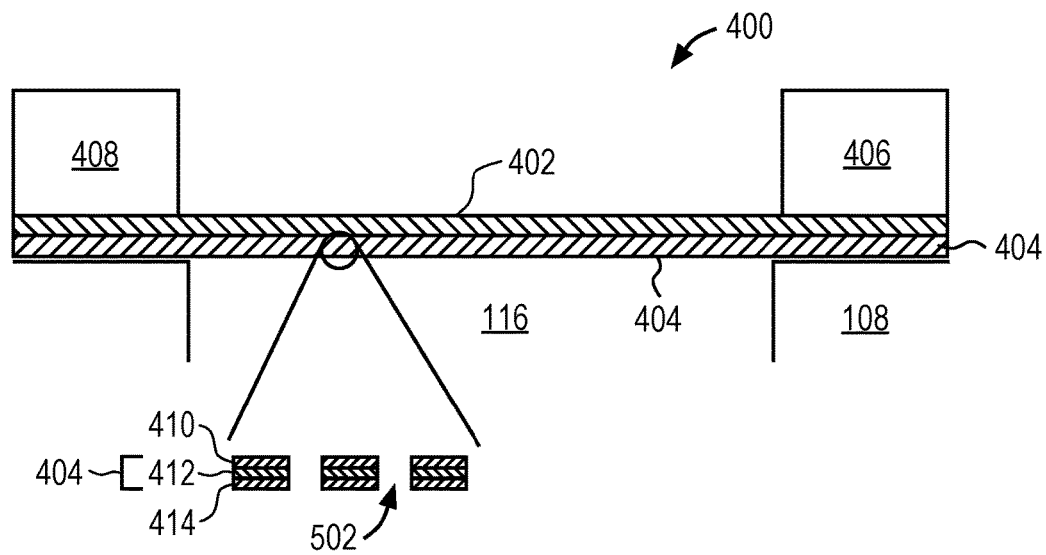
FIG. 4 is a side view of another embodiment of a filter of a MEMS device.

Representatively, FIG. 4 illustrates a side view of one embodiment of a filter assembly including a particle filter with a light barrier layer. In one embodiment, the filter assembly 400 includes a particle barrier or filter 402 connected to support members 406, 408, and a light barrier layer 404. For example, light barrier layer 404 may form the outer surface or layer of filter 402 that faces the acoustic port 116 such that it is between filter 402 and acoustic port 116. Filter 402 and support members 406, 408, may be substantially similar to filter 124 and support members 126, 128, as previously discussed in reference to FIG. 1 to FIG. 3, which are integrally formed using MEMS processing techniques. For example, filter 402, including light barrier layer 404, may have interconnected openings, holes, openings, passages, pathways, or the like, which are formed within or between, layers of silicon that prevent the passage of undesirable particles in a similar manner to that of filter 124.

Figure 5:
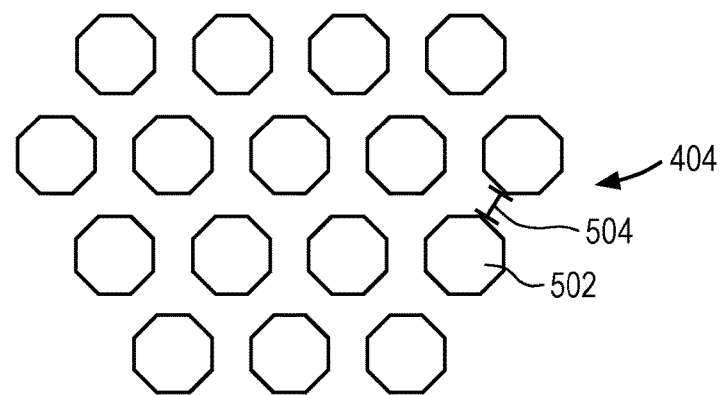
FIG. 5 is a bottom plan view of the filter of FIG. 4.

Light barrier layer 404 may be formed by, integrally formed with, or attached to, the outer layer (e.g., filter layer closest to acoustic port 116) of filter 402. For example, light barrier layer 404 may be the outer layer of filter 402, for example, filter layer or row 226A previously discussed in reference to FIG. 2B. Light barrier layer 404 therefore has the same opening or perforation pattern as the filter. For example, one representative opening or perforation pattern for light barrier layer 404 (and filter 402) is shown in FIG. 5, which is a bottom view of light barrier layer 404. From this view, it can be seen that light barrier layer 404 includes a plurality of openings 502 (e.g., vias) having spaces 504 in between. This pattern of openings 502 and spaces 504 may correspond to (or otherwise be the same as) the pattern of openings in the exterior layer or surface of filter 402 such that the openings 502 of light barrier layer 404 are the same as, or otherwise align with, the openings of filter 402.

In one embodiment, light barrier layer 404 may be a light opaque material that is plated over a surface of filter 402. In other words, light barrier layer 404 is a coating formed along a surface of filter 402 as previously discussed. In other embodiments, light barrier layer 404 may be an additional layer or membrane including a light opaque material, which is attached to filter 402. Representatively, in one embodiment, light barrier layer 404 may include a polyimide (or other suitable polymer material) based membrane and a metal or other material that is reflective or opaque to IR, visible and/or UV light, which is plated on a surface of the membrane. The light opaque material may, for example, be a metal such as gold or nickel. In still further embodiments, a b-staged adhesive layer, that is also electrically conductive, may be part of light barrier layer 404. In some embodiments, the adhesive layer may also be pressure sensitive. A stack up showing the light barrier layer 404, including the membrane layer 410, adhesive layer 412 and the opaque layer 414, and openings 502 is illustrated by the magnified view of barrier layer 404, shown in FIG. 4.

One representative processing operation for forming filter 402 including light barrier layer 404 will now be discussed. Representatively, in one embodiment, where light barrier layer 404 includes a polyimide membrane, prior to photo-imaging the polyimide membrane to form the tortious openings and pathways (e.g., for blocking particles), a layer of photo-imageable, anisotropic-conductive-pressure sensitive adhesive is laminated onto the polyimide membrane. Next, the openings or perforations having the desired pattern for particle blocking (see FIG. 5) are formed into the membrane and adhesive layer using a photo-imaging technique. The surfaces of the membrane (e.g., membrane 410) including the adhesive layer (e.g., adhesive layer 412) may then be plated with, for example, nickel and/or gold to form the light opaque layer (e.g., light blocking layer 414) to complete the light barrier layer 404. Barrier layer 404 is then positioned along (e.g. attached to) the filter 402 such that it forms the outer most layer of filter 402. It is further contemplated that in other embodiments, filter 402 is pre-formed with an outer polyimide membrane layer (and optional adhesive layer) including openings, and then plated with the light opaque material to form a light blocking layer 414 directly on the outer layer of filter 402.

Figure 6:
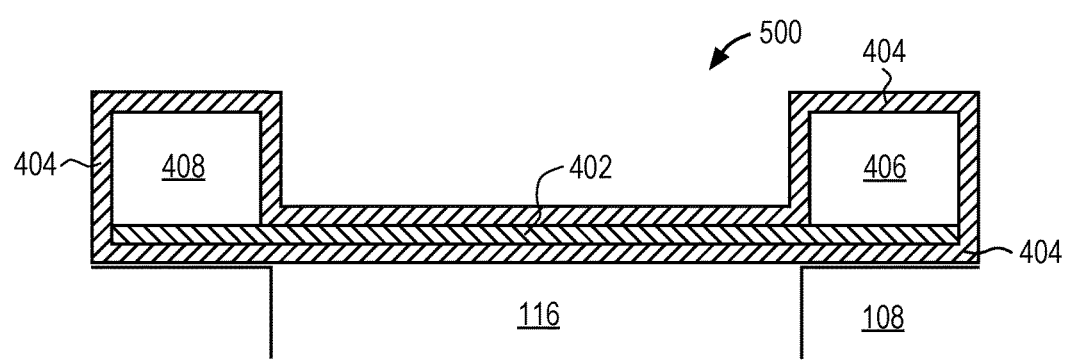
FIG. 6 is a side view of another embodiment of a filter of a MEMS device.

FIG. 6 illustrates another embodiment of a filter assembly having a particle barrier or filter and light barrier layer. In this embodiment, filter assembly 500 is substantially similar to filter assembly 400, except in this embodiment the light barrier layer 404 is formed around support members 406, 408, and an inner surface of filter 402 (e.g., surface opposite acoustic port 116). In this embodiment, light barrier layer 404 may include, for example a layer of light opaque material such as nickel or gold (e.g., light blocking layer 414), plated along the surfaces of filter assembly 500 as shown. Light barrier layer 404 may also include, in some embodiments, a polymer membrane (e.g., membrane 410) and an electrically conductive adhesive (e.g., adhesive layer 412), as previously discussed.

Figure 7:
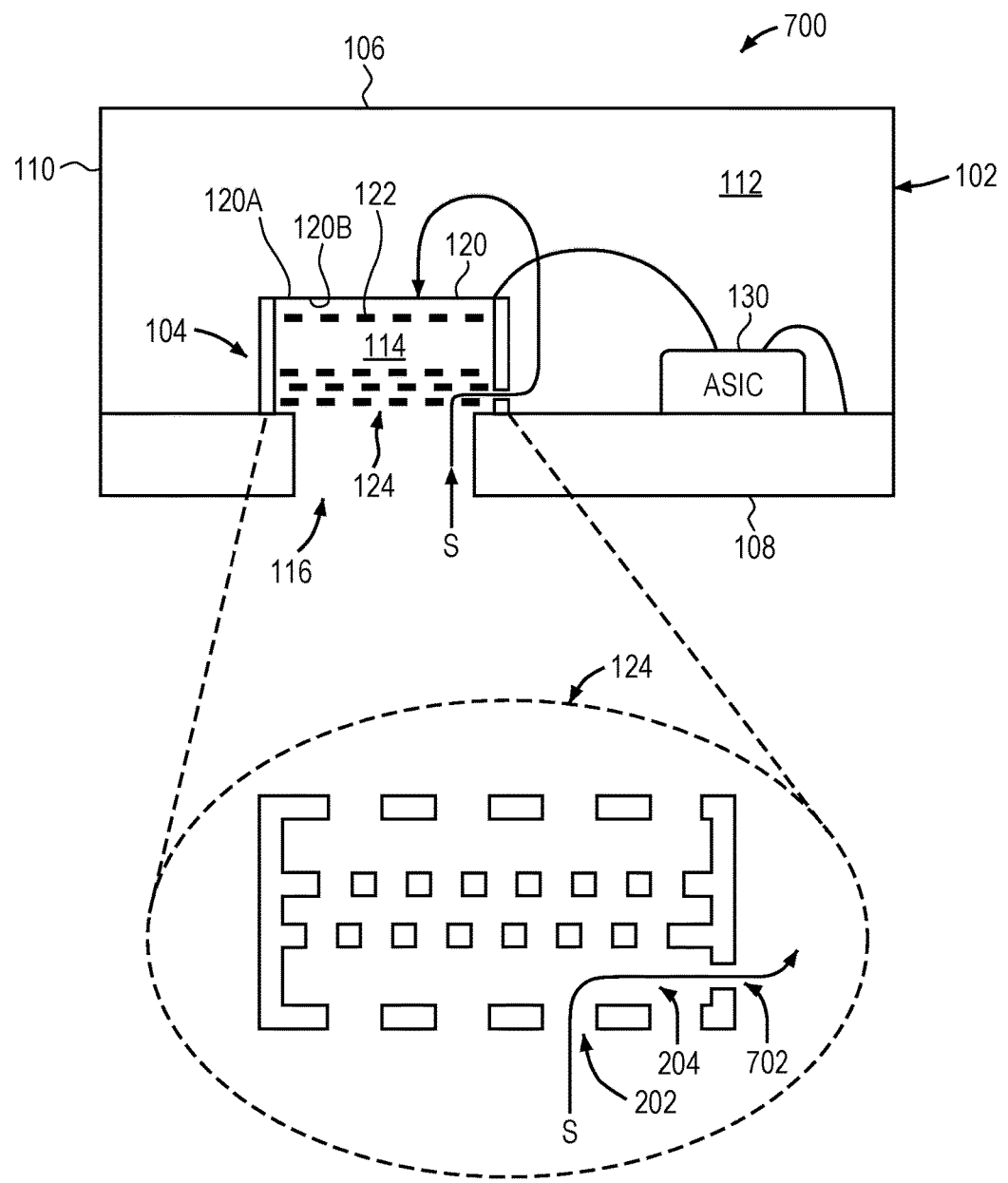
FIG. 7 is a schematic cross-section of another embodiment of a MEMS device.

FIG. 7 is a schematic cross-section of another embodiment of a MEMS device. The MEMS device may, for example, be a microphone assembly 700 that is substantially similar to microphone assembly 100 described in reference to FIG. 1. In particular, microphone assembly 700 may include an enclosure 102 having a MEMS microphone 104 positioned therein. In this embodiment, however, a leak or vent port 402 to back volume chamber or space 112 is formed through filter 124. Vent port 702 may allow for sound wave (S) to travel through filter 124 to back volume chamber or space 112 to, for example, equalize a pressure between the first side 120A and the second side 120B of sound pick-up surface 120 and reduce a sensitivity of microphone 104. It can be seen from the magnified expanded view of filter 124 that as sound (S) travels through the pathways 202, 204, vent port 402 allows for leakage out of filter 124 to the surrounding back volume chamber or space 112. Vent port 702 may have any size and shape suitable to achieve venting or leakage of a desired amount of sound to back volume chamber or space 112.

Figure 8:
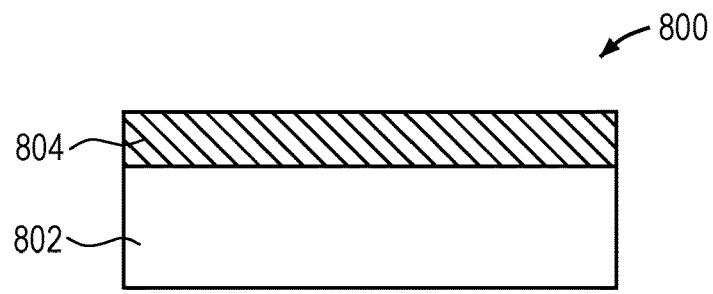
FIG. 8 illustrates one embodiment of a processing operation for manufacturing a microphone assembly.

One representative process for manufacturing microphone assembly 100 having integrated filter 124 will now be described in reference to FIG. 8-FIG. 16. In particular, FIG. 8 illustrates an initial processing operation 800 in which a sacrificial layer 804 is deposited on a substrate 802. The substrate 802 may, for example, be a silicon substrate having, or within which, circuitry may be provided for electrical connections. The sacrificial layer 804 may, for example, be a silicon dioxide layer that is deposited according to standard MEMS processing techniques.

Figure 9:
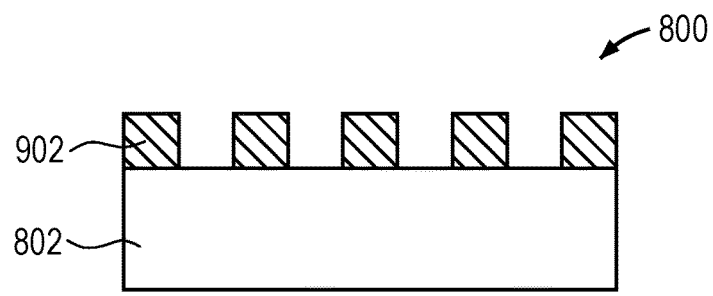
FIG. 9 illustrates one embodiment of a further processing operation for manufacturing a microphone assembly.

FIG. 9 illustrates a further processing operation 900 in which the sacrificial layer 804 is etched to form a patterned sacrificial layer 902. The patterned sacrificial layer 902 will form the axially oriented pathways within the filter once it is removed. Sacrificial layer 804 may be selectively etched by photolithography and a wet etch or a dry etch according to standard MEMS processing techniques. Representative etchants may include, but are not limited it, an acid (e.g., hydrofluoric acid, buffered hydrofluoric acid, nitric acid based etchants or the like), ionized gas or plasma.

Figure 10:
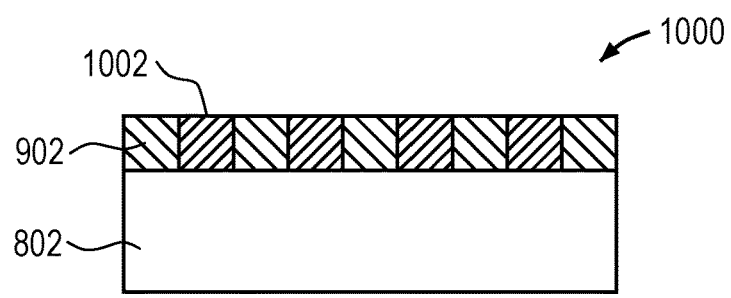
FIG. 10 illustrates one embodiment of a further processing operation for manufacturing a microphone assembly.
Figure 11:
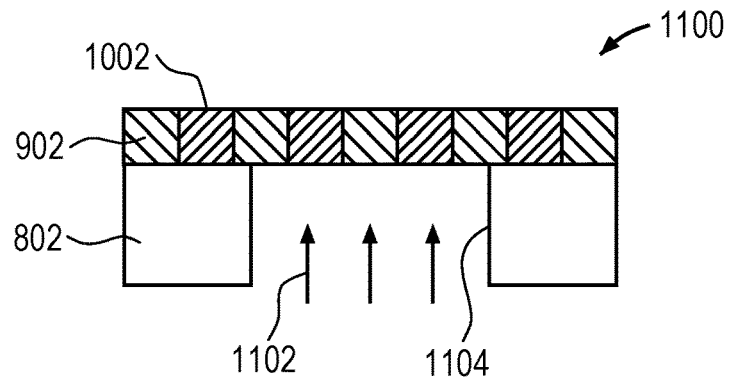
FIG. 11 illustrates one embodiment of a further processing operation for manufacturing a microphone assembly.

FIG. 10 illustrates the further processing operation 1000 of applying a polysilicon layer 1002 to the patterned sacrificial layer 902. The polysilicon layer 1002 may be planarized such that it is level with the top of the sacrificial layer 902. Once the polysilicon layer 1002 is applied and planarized, a further etching operation 1102 is performed to etch an opening 1104 within substrate 802 as shown in processing operation 1100 of FIG. 11.

Figure 12:
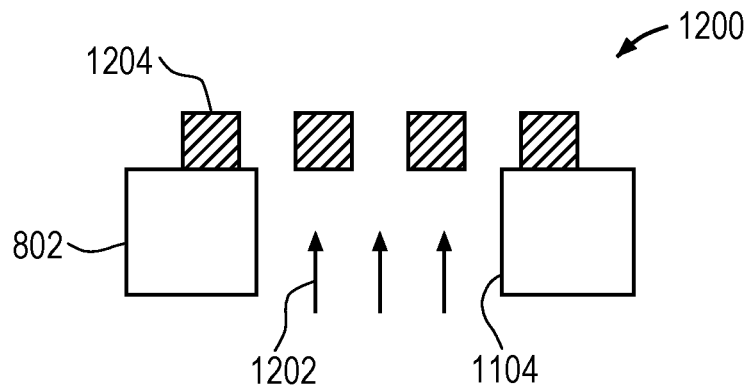
FIG. 12 illustrates one embodiment of a further processing operation for manufacturing a microphone assembly.

Opening 1102 is then used to remove (such as by etching as illustrated by arrows 1202) patterned sacrificial layer 902 leaving behind a first layer of pathways 1204 (e.g., axial pathways 202 shown in row 226A of FIG. 2A) as shown in processing operation 1200 of FIG. 12. Operations 800, 900, 1000, 1100 and 1200 may then be repeated as many times as necessary to form a stack up of axially and laterally oriented pathways within the filter (e.g., laterally oriented pathway 204 of row 228A and axially oriented pathways 202 of row 226B as discussed in FIG. 2A).

Figure 13:
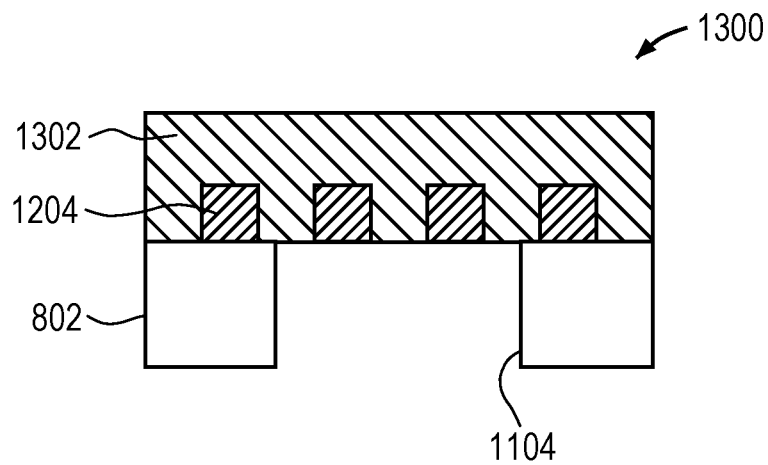
FIG. 13 illustrates one embodiment of a further processing operation for manufacturing a microphone assembly.
Figure 14:
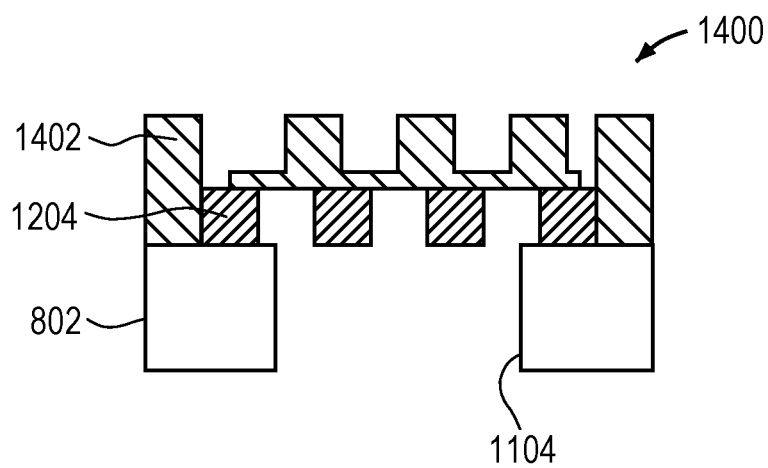
FIG. 14 illustrates one embodiment of a further processing operation for manufacturing a microphone assembly.
Figure 15:
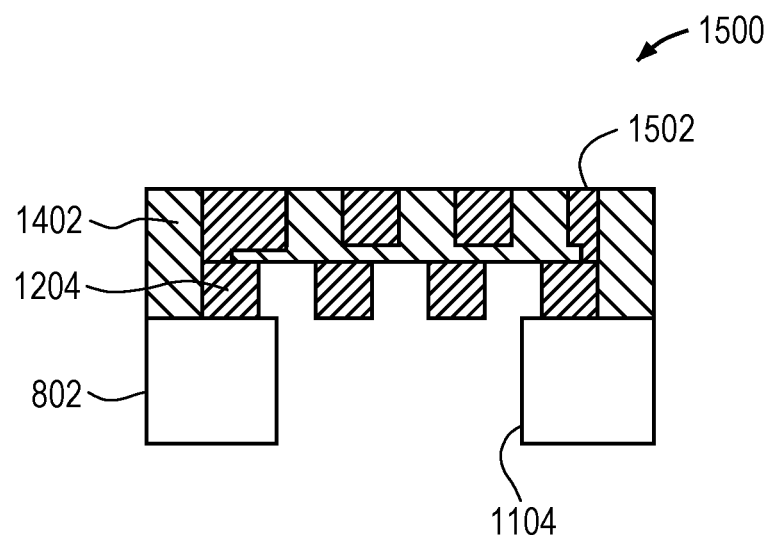
FIG. 15 illustrates one embodiment of a further processing operation for manufacturing a microphone assembly.
Figure 16:
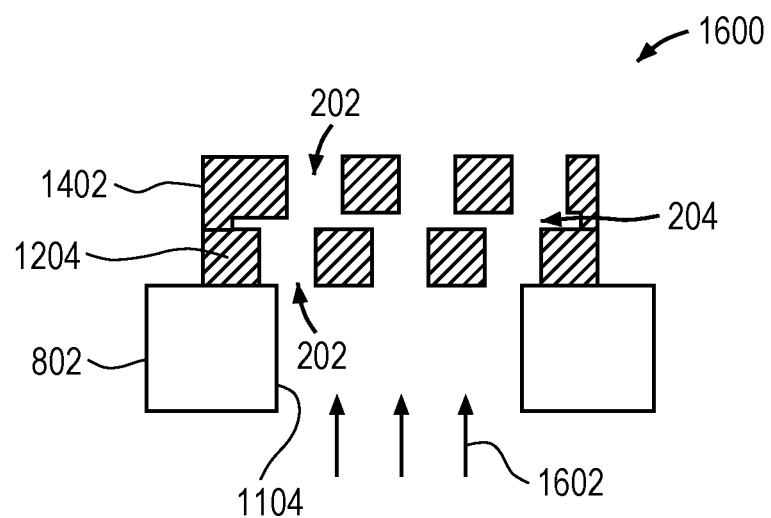
FIG. 16 illustrates one embodiment of a further processing operation for manufacturing a microphone assembly.

Representatively, an additional sacrificial layer 1302 (e.g., silicon dioxide) may be applied to first layer of pathways 1204 as shown in operation 1300 of FIG. 13. Sacrificial layer 1302 may be etched as previously discussed to form a patterned sacrificial layer 1402, which will define the openings which form a second and third layer of pathways as shown in operation 1400 of FIG. 14. In this aspect, patterned sacrificial layer 1402 may be patterned so that any axial pathways or openings will be offset with respect to the axially oriented pathways or openings in first layer of pathways 1204. In addition, the patterned sacrificial layer 1402 may be patterned to create spacers which will form a gap or spacing between axial pathways or openings, and in turn, the lateral pathways. Once patterned sacrificial layer 1402 is formed, polysilicon layer 1502 is formed around patterned sacrificial layer 1402 in operation 1500 shown in FIG. 15. As shown in operation 1600 of FIG. 16, patterned sacrificial layer 1402 is then removed (e.g., etched as shown by arrows 1602 using opening 1104 of substrate 802) leaving behind a second layer of pathways 1502 stacked on top of first layer of pathways 1204. Second layer of pathways 1502 may include axially oriented pathways 202 and laterally oriented pathway 204, as previously discussed.

Figure 17:
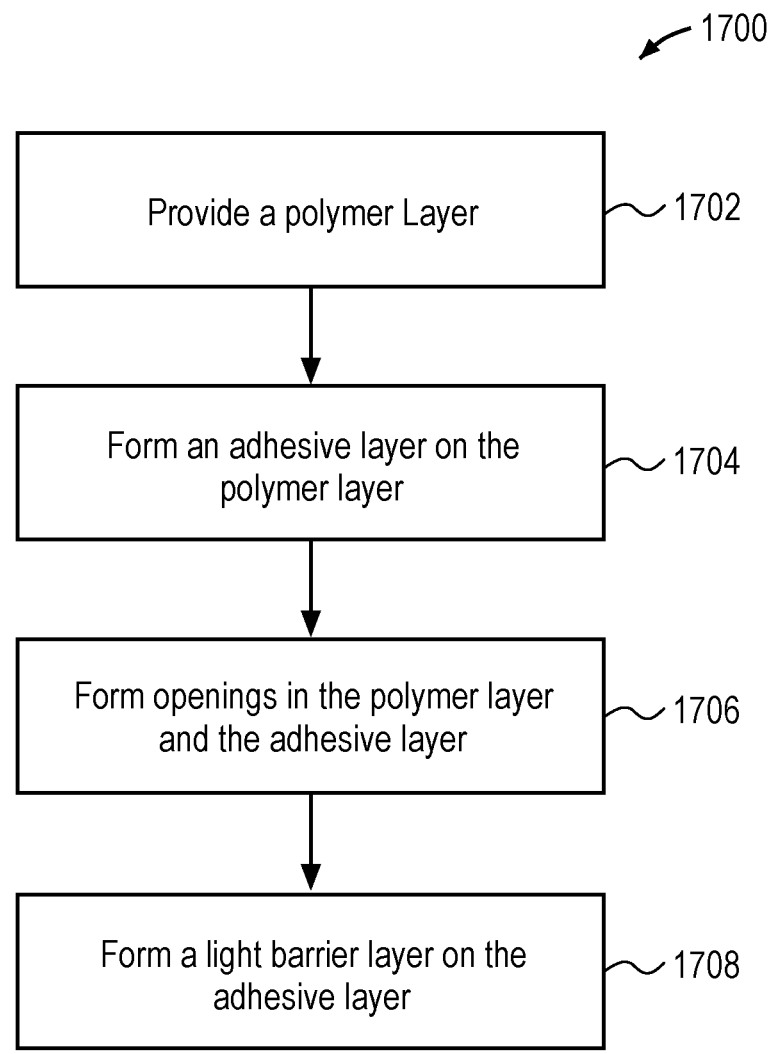
FIG. 17 illustrates a block diagram of further processing operation for manufacturing a microphone assembly.

FIG. 17 shows a further processing operation 1700 for forming a light barrier layer or filter as previously discussed in reference to FIG. 4 to FIG. 6. Representatively, operation 1700 may include the further operations (in addition to the previously discussed operations 800-1600) of providing a polymer layer (block 1702). The polymer layer may be, for example, a layer formed by any of the previously discussed processing operations, or more specifically, may be a polyimide membrane layer. An adhesive layer may then be formed on the polymer layer (block 1704). The adhesive layer may be formed, for example, by laminating an adhesive material on the polymer layer. The adhesive layer may be, for example, an electrically conductive adhesive layer. Next, openings may be formed in the polymer layer, having the adhesive layer formed thereon (block 1706). The openings, may for example, correspond to the tortuous pattern of openings, pathways or perforations previously discussed in reference to the particle filter (e.g., filter 124). A light barrier layer may then be formed on the adhesive layer (block 1708). Representatively, the light barrier layer may be formed by coating or plating a surface of the adhesive layer with a light opaque or reflective material (e.g., a metal such as nickel or gold). It should be understood that the light barrier layer is formed on the surfaces of the adhesive layer and therefore does not cover the performed openings.

One representative processing operation for forming filter 402 including light barrier layer 404 will now be discussed. Representatively, in one embodiment, where light barrier layer 404 includes a polyimide membrane, prior to photo-imaging the polyimide membrane to form the tortious openings and pathways (e.g., for blocking particles), a layer of photo-imageable, anisotropic-conductive-pressure sensitive adhesive is laminated onto the polyimide membrane. Next, the openings or perforations having the desired pattern for particle blocking (see FIG. 5) are formed into the membrane and adhesive layer using a photo-imaging technique. The surfaces of the membrane (e.g., membrane 410) including the adhesive layer (e.g., adhesive layer 412) may then be plated with, for example, nickel and/or gold to form the light opaque layer (e.g., light blocking layer 414) to complete the light barrier layer 404. Barrier layer 404 is then positioned along (e.g. attached to) the filter 402 such that it forms the outer most layer of filter 402. It is further contemplated that in other embodiments, filter 402 is pre-formed with an outer polyimide membrane layer (and optional adhesive layer) including openings, and then plated with the light opaque material to form a light blocking layer 414 directly on the outer layer of filter 402.

Once the desired number of material layers and pathways are formed, the MEMS processing operations may continue to form the rest of the microphone (e.g., sound pick-up surface 120 and back plate 122) according to any suitable MEMS processing techniques. In addition, it should be understood that while FIG. 8-FIG. 16 show a single MEMS device being formed, the operations disclosed herein may be part of a batch processing technique in which any number of additional MEMS devices are also being produced simultaneously on a single substrate (e.g., substrate 802). Once all of the MEMS devices are complete, they are then separated (e.g., using a dicing operation) into individual MEMS devices for integration within the desired electronic device. For example, the separated MEMS devices may be MEMS microphones having an integrated filter, which can then be mounted to a substrate of the device within which it is to be implemented. In addition, it should be understood that because the filter is integrally formed with the MEMS microphone during MEMS processing, the filter is confined to the area of the MEMS microphone and has substantially the same footprint as the other components of the MEMS microphone (e.g., sound pick-up surface and back plate). Thus, the resulting MEMS microphone achieves particle filtration without increasing the overall size of the device package or requiring any additional manufacturing operations once MEMS processing is complete. Still further, as previously discussed, each of the layers used to form the filter and its interconnected pathways are made of polysilicon using MEMS processing operations, and are not intended to include any metal layers interspersed between the polysilicon layers or otherwise within of among the filter layers and/or pathways.

Figure 18:
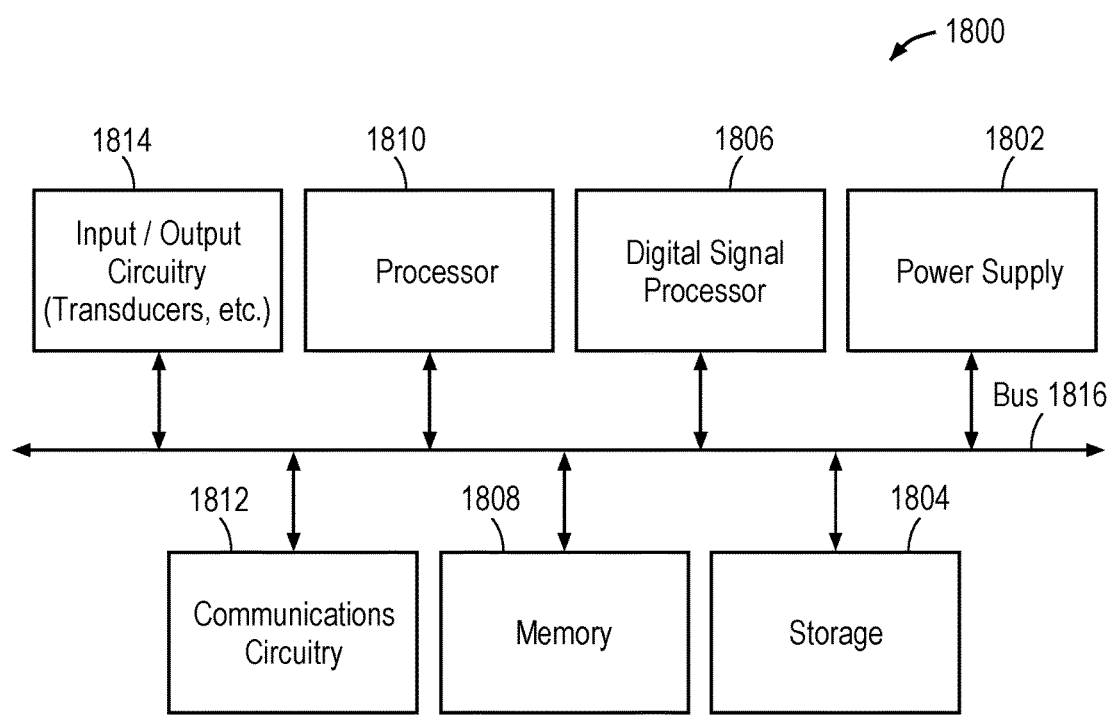
FIG. 18 illustrates a block diagram of some of the constituent components of an embodiment of an electronic device in which an embodiment of the invention may be implemented.

Turning now to FIG. 18, FIG. 18 illustrates a simplified schematic view of one embodiment of an electronic device in which a microphone as described herein may be implemented. For example, a portable electronic device is an example of a system that can include some or all of the circuitry illustrated by electronic device 1800.

Electronic device 1800 can include, for example, power supply 1802, storage 1804, signal processor 1806, memory 1808, processor 1810, communication circuitry 1812, and input/output circuitry 1814. In some embodiments, electronic device 1800 can include more than one of each component of circuitry, but for the sake of simplicity, only one of each is shown in FIG. 18. In addition, one skilled in the art would appreciate that the functionality of certain components can be combined or omitted and that additional or less components, which are not shown in FIGS. 1-7, can be included in, for example, the portable device.

Power supply 1802 can provide power to the components of electronic device 1800. In some embodiments, power supply 1802 can be coupled to a power grid such as, for example, a wall outlet. In some embodiments, power supply 1802 can include one or more batteries for providing power to an ear cup, headphone or other type of electronic device associated with the headphone. As another example, power supply 1802 can be configured to generate power from a natural source (e.g., solar power using solar cells).

Storage 1804 can include, for example, a hard-drive, flash memory, cache, ROM, and/or RAM. Additionally, storage 1804 can be local to and/or remote from electronic device 1800. For example, storage 1804 can include integrated storage medium, removable storage medium, storage space on a remote server, wireless storage medium, or any combination thereof. Furthermore, storage 1804 can store data such as, for example, system data, user profile data, and any other relevant data.

Signal processor 1806 can be, for example, a digital signal processor, used for real-time processing of digital signals that are converted from analog signals by, for example, input/output circuitry 1814. After processing of the digital signals has been completed, the digital signals could then be converted back into analog signals.

Memory 1808 can include any form of temporary memory such as RAM, buffers, and/or cache. Memory 1808 can also be used for storing data used to operate electronic device applications (e.g., operation system instructions).

In addition to signal processor 1806, electronic device 1800 can additionally contain general processor 1810. Processor 1810 can be capable of interpreting system instructions and processing data. For example, processor 1810 can be capable of executing instructions or programs such as system applications, firmware applications, and/or any other application. Additionally, processor 1810 has the capability to execute instructions in order to communicate with any or all of the components of electronic device 1800. For example, processor 1810 can execute instructions stored in memory 1808 to enable or disable ANC.

Communications circuitry 1812 may be any suitable communications circuitry operative to initiate a communications request, connect to a communications network, and/or to transmit communications data to one or more servers or devices within the communications network. For example, communications circuitry 1812 may support one or more of Wi-Fi (e.g., a 802.11 protocol), Bluetooth®, high frequency systems, infrared, GSM, GSM plus EDGE, CDMA, or any other communication protocol and/or any combination thereof.

Input/output circuitry 1814 can convert (and encode/decode, if necessary) analog signals and other signals (e.g., physical contact inputs, physical movements, analog audio signals, etc.) into digital data. Input/output circuitry 1814 can also convert digital data into any other type of signal. The digital data can be provided to and received from processor 1810, storage 1804, memory 1808, signal processor 1806, or any other component of electronic device 1800. Input/output circuitry 1814 can be used to interface with any suitable input or output devices, such as, for example, microphone 104 of FIGS. 1-7. Furthermore, electronic device 1800 can include specialized input circuitry associated with input devices such as, for example, one or more proximity sensors, accelerometers, etc. Electronic device 1800 can also include specialized output circuitry associated with output devices such as, for example, one or more speakers, earphones, etc.

Lastly, bus 1816 can provide a data transfer path for transferring data to, from, or between processor 1810, storage 1804, memory 1808, communications circuitry 1812, and any other component included in the electronic device. Although bus 1816 is illustrated as a single component in FIG. 18, one skilled in the art would appreciate that electronic device 1800 may include one or more components.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. A micro-electro-mechanical system (MEMS) transducer comprising:
   an enclosure defining an interior space and having an acoustic port formed through at least one side of the enclosure;
   a compliant member positioned within the interior space and acoustically coupled to the acoustic port, the compliant member being configured to vibrate in response to an acoustic input;
   a back plate positioned within the interior space, the back plate being positioned along one side of the compliant member in a fixed position;
   a particle filter positioned between the compliant member and the acoustic port, wherein the particle filter comprises a plurality of material layers that define a plurality of axially oriented pathways and a plurality of laterally oriented pathways which are acoustically interconnected, the plurality of axially oriented pathways extending through the plurality of material layers and the plurality of laterally oriented pathways extending between the plurality of material layers; and
   a light filter positioned between the particle filter and the acoustic port, wherein the light filter is reflective or opaque to light in at least one of an infrared (IR), visible or ultraviolet (UV) light wavelength range.

2. The MEMS transducer of claim 1 wherein the light filter comprises a light barrier material formed on a surface of the particle filter that faces the acoustic port.

3. The MEMS transducer of claim 1 wherein the light filter comprises a metal plated on a surface of the particle filter.

4. The MEMS transducer of claim 1 wherein the light filter comprises at least two different material layers.

5. The MEMS transducer of claim 4 wherein at least one of the at least two different material layers comprises a polymer material.

6. The MEMS transducer of claim 4 wherein at least one of the at least two different material layers comprises nickel or gold.

7. The MEMS transducer of claim 4 wherein the light filter comprises at least three different material layers, and at least one of the at least three different material layers comprises an adhesive layer.

8. The MEMS transducer of claim 1 wherein the light filter comprises a polymer layer, an adhesive layer on the polymer layer and a metal layer on the adhesive layer.

9. The MEMS transducer of claim 1 wherein the light filter comprises a plurality of openings that are aligned with the plurality of axially oriented pathways of the particle filter.

10. The MEMS transducer of claim 1 wherein the light filter is formed by one of the material layers of the plurality of material layers of the particle filter.

11. The MEMS transducer of claim 1 wherein the transducer is a MEMS microphone assembly.

12. A micro-electro-mechanical system (MEMS) microphone assembly comprising:
    a substrate through which an acoustic port is formed; and
    a MEMS microphone coupled to the substrate, the MEMS microphone having a compliant member acoustically coupled to the acoustic port, a back plate positioned along one side of the compliant member in a fixed position and a filter, the filter comprising a plurality of material layers defining a plurality of pathways that are acoustically interconnected, wherein the plurality of pathways comprise holes formed through each material layer of the plurality of material layers and spaces separating each of the plurality of material layers, and at least one material layer of the plurality of material layers is opaque or reflective to light in at least one of an infrared (IR), visible or ultraviolet (UV) light wavelength range.

13. The MEMS microphone assembly of claim 12 wherein the plurality of material layers comprises at least one silicon layer and at least one metal layer, and the metal layer is formed between the silicon layer and the acoustic port.

14. The MEMS microphone assembly of claim 12 wherein the at least one material layer of the plurality of material layers that is opaque or reflective to light prevents light from entering the filter.

15. The MEMS microphone assembly of claim 12 wherein the at least one material layer of the plurality of material layers that is opaque or reflective to light comprises a stack up of a polymer layer, an adhesive layer and a metal layer.

16. The MEMS microphone assembly of claim 12 wherein the at least one material layer of the plurality of material layers that is opaque or reflective to light comprises axially oriented holes.

17. The MEMS microphone assembly of claim 12 wherein the at least one material layer of the plurality of material layers that is opaque or reflective to light comprises a metal coating.

18. The MEMS microphone assembly of claim 12 wherein at least two material layers of the plurality of material layers are opaque or reflective to light in at least one of an infrared (IR), visible or ultraviolet (UV) light wavelength range, and one material layer of the at least two material layers faces the acoustic port and another material layer of the at least two material layers faces the compliant member.

19. A method of manufacturing a micro-electro-mechanical system (MEMS) microphone assembly, the method comprising:
   providing a substrate having an acoustic port; and
   forming a MEMS microphone on the substrate, the MEMS microphone having a compliant member, a back plate positioned along one side of the compliant member, a particle filter comprising a plurality of pathways that are acoustically interconnected and dimensioned to prevent passage of a particle to the compliant member, and a light filter that is opaque or reflective to light, wherein the light filter comprises a plurality of openings that are acoustically interconnected with the plurality of pathways.

20. The method of manufacturing of claim 19 wherein forming the light filter of the MEMS microphone comprises:
   providing a polymer layer;
   laminating the polymer layer with an electrically conductive adhesive layer;
   forming openings in the polymer layer and the electrically conductive adhesive layer; and
   forming a light barrier layer on a surface of the electrically conductive adhesive layer.

\* \* \* \* \*